(12) United States Patent
Aga

(10) Patent No.: US 6,358,629 B1
(45) Date of Patent: Mar. 19, 2002

(54) EPOXY RESIN COMPOSITION AND SEMICONDUCTOR DEVICE USING THE SAME

(75) Inventor: Fumiaki Aga, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/713,010

(22) Filed: Nov. 16, 2000

Related U.S. Application Data

(63) Continuation-in-part of application No. 09/394,094, filed on Sep. 13, 1999, now abandoned.

(30) Foreign Application Priority Data

Mar. 31, 1999 (JP) .............................................. 11-91706

(51) Int. Cl.[7] .............................................. H01L 29/12
(52) U.S. Cl. ..................... 428/620; 257/789; 257/791; 257/792; 257/793; 523/435; 523/443
(58) Field of Search ................................. 523/443, 435; 257/789, 791, 792, 793; 428/620

(56) References Cited

U.S. PATENT DOCUMENTS 4,450,457 A   5/1984   Miyachi et al.
6,143,423 A * 11/2000   Shiobara ..................... 428/620

* cited by examiner

Primary Examiner—Philip Tucker
Assistant Examiner—D. Aylward
(74) Attorney, Agent, or Firm—Leydig, Voit, & Mayer, Ltd.

(57) ABSTRACT

There is provided a resin composition having high flame retardancy, which improves high temperature storage of an epoxy resin composition comprising an epoxy resin having biphenyl structure without a halogenated flame retardant and an antimony compound as a conventional flame retardant. High temperature storage was improved, a glass transition temperature (Tg) became not less than 150° C. and V-0 class in flame retardance standard (UL94) was accomplished by employing (1) an epoxy resin having biphenyl structure mainly as an epoxy resin, (2) a phenolic aralkyl resin mainly as a curing agent, (3) 0.5 to 30 parts by weight of a polyimide resin as an additive based on total 100 parts by weight of the epoxy resin and the curing agent, (4) a polysiloxane compound modified with polyether containing an amino group as a flame retardant, (5) not less than 87% by weight of a fused silica as an inorganic filler based on the total composition.

6 Claims, No Drawings

EPOXY RESIN COMPOSITION AND SEMICONDUCTOR DEVICE USING THE SAME

CROSS-REFERENCE TO RELATED APPLICATION

This is a continuation-in-part of co-pending application Ser. No. 09/394,094 filed on Sep. 13, 1999 the disclosure of which is incorporated by reference.

BACKGROUND OF THE INVENTION

The present invention relates to an epoxy resin composition employed for encapsulation material of a semiconductor device and a semiconductor device using the same.

Recently as an encapsulation process for a semiconductor device, there has been mainly investigated an encapsulation process for a semiconductor by employing an epoxy resin composition, mainly comprising an epoxy resin, a curing agent and inorganic filler. Properties claimed for the encapsulation material have become severer year after year with increasing thermal resistance, reliability at a high temperature, reliability at high humidity and the like claimed for a semiconductor device. Among those, in order to improve crack resistance for moisture adsorption of the package, there has been developed and already employed practically encapsulation material comprising an epoxy resin having biphenyl structure having low moisture adsorption as an epoxy resin.

However, since the encapsulation material made from the epoxy resin having biphenyl structure generally has a glass transition temperature (Tg) of at most 130° C., there was a problem of low reliability such as high temperature storage.

And as usual in order to maintain safety of the encapsulation material, the material contained a halogenated flame retardant such as a brominated epoxy resin as a flame retardant and an antimony compound such as antimony trioxide. But recently the environmental problems have become highly important, these compounds have been regarded as questionable even in ISO 14000. Therefore, a new flame retardant has been attempted to employ with environmental consideration. For example, there have been proposed an epoxy resin composition excellent in flame retardancy and reliability at a high temperature, which contains a phosphate compound, a red phosphorus flame retardant or the like without the halogenated flame retardant and the antimony compound as the conventional flame retardant. However, in case of employing the phosphate compound, there arises a problem of lowering reliability at high humidity due to apprehension of acid corrosion.

SUMMARY OF THE INVENTION

The present invention was made to solve the above mentioned problems. And the object of the present invention is to improve high temperature storage of an epoxy resin composition comprising an epoxy resin having biphenyl structure, and to provide a resin composition having high flame retardancy without a halogenated flame retardant and an antimony compound as a conventional flame retardant. Furthermore, the object is to provide a semiconductor device having high reliability obtained by employing the above mentioned epoxy resin composition as encapsulation material.

Namely, the present invention relates to an epoxy resin composition for semiconductor encapsulation comprising an epoxy resin, a curing agent, inorganic filler, a catalyst, a flame retardant, and an additive, wherein the composition is obtained by employing the epoxy resin mainly containing an epoxy resin having biphenyl structure, the phenolic resin mainly containing a zylok type phenolic resin (namely a phenolic aralkyl resin), a polysiloxane compound modified with polyether containing an amino group as the flame retardant, a polyimide resin as the additive, and not less than 87% by weight (usually 87 to 92% by weight) of the inorganic filler based on the total-composition.

And an amount of the polyimide resin as an additive is preferably 0.5 to 30 parts by weight based on total 100 parts by weight of the epoxy resin and the curing agent.

The polyimide resin as an additive is preferably the resin having both end groups thereof modified with an epoxy resin or a phenolic resin.

Further, the inorganic filler is preferably silica particle powder such as fused silica having a maximum particle diameter of not more than 75 $\mu$m (an average particle diameter is usually 0.1 to 50 $\mu$m).

The catalyst is preferably a phosphorus catalyst or a latent phosphorus catalyst.

A semiconductor device of the present invention is encapsulated by one of the above-mentioned epoxy resin compositions, wherein a semiconductor element is mounted on an iron frame, and loop length of a wire bond is not more than 3 mm.

And a semiconductor device of the present invention is encapsulated by one of the above-mentioned epoxy resin compositions, wherein a semiconductor element is mounted on a copper frame, and loop length of a wire bond is not less than 3 mm.

DETAILED DESCRIPTION

EMBODIMENT 1

Table 1 shows composition of the epoxy resin composition in embodiment 1 of the present invention. The epoxy resin composition of the present embodiment comprises an epoxy resin, a curing agent, an inorganic filler, a catalyst, a flame retardant and an additive which is employed for semiconductor encapsulation material. The embodiment 1 of the present invention is explained below based on Table 1. "Parts" or "%" in Detailed Description respectively means "parts by weight" or "%" by weighty, unless otherwise specified.

TABLE 1

Compositions of the epoxy resin composition

| name | content | amount, other |
|---|---|---|
| epoxy resin | main- epoxy resin having biphenyl structure, sub- epoxy resin having terpene structure, cresol novolak epoxy resin, or epoxy resin having naphthalene structure | 0 to 30 parts of epoxy resin having terpene structure, cresol novolak epoxy resin, or epoxy resin having naphthalene structure based on 100 parts of epoxy resin having biphenyl structure as a main component |
| curing agent | main- phenolic aralkyl resin, sub- phenolic resin having terpene structure, phenolic novolak resin, or phenolic resin having naphthalene structure | 0 to 30 parts of phenolic resin having terpene structure, a phenolic novolak resin or phenolic resin having naphthalene structure based on 100 parts of phenolic aralkyl resin as a main component 0.5 to 1.5 moles of a phenolic hydroxy group based on 1 mole of an epoxy group |
| additive | a polyimide resin | 0.5 to 30 parts based on 100 parts of an epoxy resin and a curing agent |
| inorganic filler | fused silica | not less than 87% in the total composition not more than 75 μm of maximum particle diameter |
| catalyst | a phosphorus catalyst, or a latent phosphorus catalyst | 0.5 to 5 parts based on 100 parts of an epoxy resin and a curing agent |
| flame retardant | a polysiloxane compound modified with polyether containing an amino group | 0.2 to 5 parts based on 100 partrs of an epoxy resin and a curing agent |
| coupling agent | epoxy silane or amino silane | depending on an amount of an inorganic filler |
| mold releasing agent | a natural carnauba wax or a natural/synthetic ester wax | 1 to 10% in the total composition |
| pigment | carbon black | 0.5 to 10% in the total composition |

The epoxy resin composition of the present embodiment is obtained by mainly employing an epoxy resin having biphenyl structure as an epoxy resin. But the epoxy resin having biphenyl structure as a main component may be mixed with an epoxy resin having terpene structure, a cresol novolak epoxy resin or an epoxy resin having naphthalene structure. In this case, 100 parts by weight of the epoxy resin having biphenyl structure as a main component can be mixed with 0 to 30 parts by weight of an epoxy resin having terpene structure, a cresol novolak epoxy resin or an epoxy resin having naphthalene structure.

As a curing agent, a phenolic aralkyl resin is mainly employed. But the phenolic aralkyl resin as a main component may be mixed with a phenolic resin having terpene structure, a phenolic novolak resin or a phenolic resin having naphthalene structure. In this case, 100 parts by weight of the phenolic aralkyl resin as a main component can be mixed with 0 to 30 parts by weight of a phenolic resin having terpene structure, a phenolic novolak resin or a phenolic resin having naphthalene structure. Mixing ratio of an epoxy resin and a curing agent is preferably 0.5 to 1.5 mole of a phenolic hydroxy group of the curing agent based on 1 mole of an epoxy group of the epoxy resin.

The chemical structures of these epoxy resins and these curing agents are respectively shown in the following Table 2 and Table 3.

TABLE 2

| epoxy resin | chemical structure |
|---|---| biphenyl type (general formula)

[structure with $R_1$ to $R_8$]

(wherein $R^1$ to $R^8$ respectively represent a hydrogen atom or a methyl group)

(YX-4000)

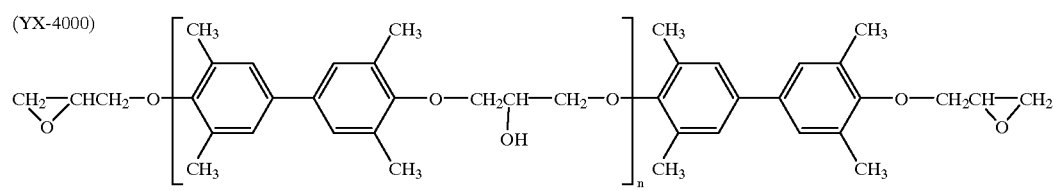

(wherein n is an integer of 0 to 5)

TABLE 2-continued
| epoxy resin | chemical structure |
| --- | --- |
| terpene type | 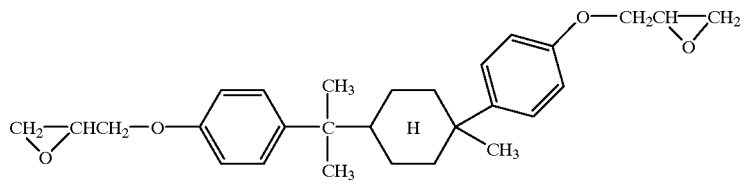 |
| cresol novolak type | 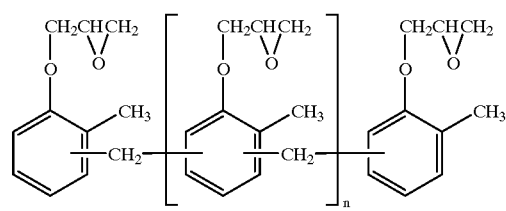<br>(wherein n is an integer of 0 to 10) |
| naphthalene type | 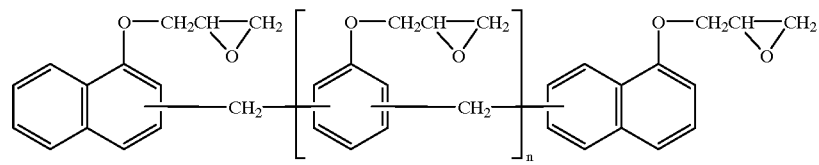<br>(wherein n is an integer of at least 1) |
TABLE 3
| phenolic resin | chemical structure |
| --- | --- |
| phenolic aralkyl type | 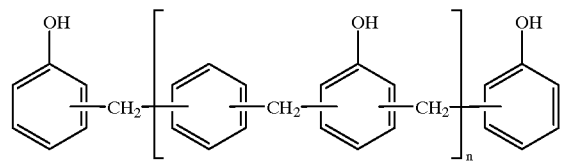<br>(wherein n is an integer of 1 to 5) |
| terpene type | 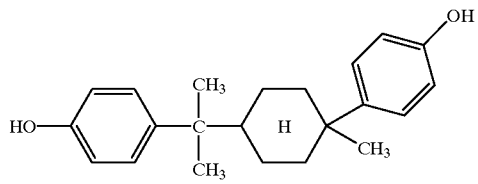 |
| phenolic novolak type | 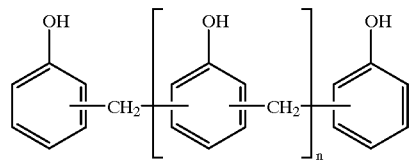<br>(wherein n is an integer of 0 to 10) |

TABLE 3-continued

| phenolic resin | chemical structure |
|---|---|
| naphthalene type | 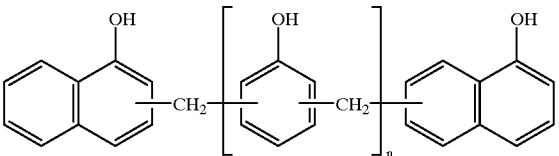 (wherein n is an integer of at least 1) |

In the present embodiment a polyimide resin is employed as an additive in order to raise a glass transition temperature of the epoxy resin composition and to achieve excellent high temperature storage. Examples thereof are poly(amide-bismaleimide), poly(pyromellitic imide), poly(ether imide), poly(amide-imide) and the like. A polyimide resin, of which both end groups are modified with an epoxy resin or a phenolic resin, may be employed. In these cases, 0.5 to 30 parts by weight of a polyimide resin is preferably mixed based on total 100 parts by weight of an epoxy resin and a curing agent.

As an inorganic filler, fused silica having maximum particle diameter of not more than 75 μm is employed. But in case of a super small size package such as CSP type (chip scale package), fused silica having maximum particle diameter of not more than 50 μm is preferably employed. The epoxy resin composition of the present embodiment contains not less than 87% by weight of the inorganic filler based on the total composition.

As a catalyst, a phosphorus catalyst and a latent phosphorus catalyst are employed. As the phosphorus catalyst, for instance, triphenylphosphine (hereinafter referred to as "TPP") is employed. As the latent phosphorus catalyst, for instance, triphenylphosphonium-tetraphenylborate (hereinafter referred to as "TPP-TPB"), butyltriphenylphosphonium-tetraphenylborate (hereinafter referred to as "BTPP-TPB"), tetrabutylphosphonium-tetraphenylborate (hereinafter referred to as "TBP-TPB") are employed. An amount of the catalyst is suitably 0.5 to 5 parts by weight based on total 100 parts by weight of an epoxy resin and a curing agent. There is no particular limitation for the catalyst employed in the present invention, as long as it promotes curing reaction between an epoxy resin and a curing agent.

In the present Embodiment, a polysiloxane compound modified with polyether containing an amino group is employed instead of a conventional halogenated flame retardant and an antimony compound. The polysiloxane compound modified with polyether containing an amino group is a highly stable silicone compound, which has been generally employed as glue and the like. The compound has high function as a flame retardant and is extremely excellent in electrical property, mechanical property, corrosion resistance and the like, if it is employed as a package. An amount thereof is suitably 0.2 to 5 parts by weight based on total 100 parts by weight of an epoxy resin and a curing agent. A chemical structure of a polysiloxane compound modified with polyether containing an amino group is shown in the following general formula (1).

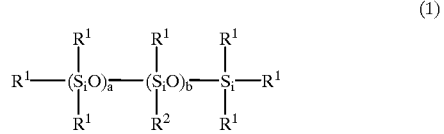

(1)

wherein $R^1$ represents a methyl group, $R^2$ represents a polyether group containing an amino group, a and b respectively represent a positive integer of 1 to 100 in the formula (1). Example of $R^2$ is the following group.

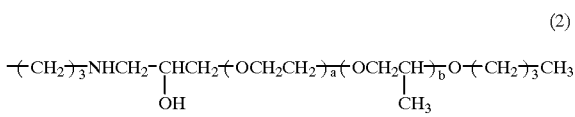

(2)

wherein a represents a positive integer of 20 to 100 and b represents a positive integer of 10 to 50 in the formula (2).

In the present embodiment except for the above-mentioned compounds there can be added epoxy silane as a coupling agent; a natural carnauba wax or a synthetic ester wax as a mold releasing agent; carbon black as a pigment; and the like.

A preparation method for an epoxy resin composition of the present embodiment is briefly explained below. In case of a liquid epoxy resin composition, the composition can be prepared by fully kneading the above-mentioned materials at 20 to 50° C. employing a stirring mixing machine such as a mixer. On the other hand, in case of a powder epoxy resin composition, the composition can be prepared by fully kneading the above-mentioned materials employing a twin roll, a continuous kneading machine or the like after uniformly mixing employing a high speed mixing machine or the like. In this case, a mixing temperature is. preferably about 50 to 110° C. After kneading, the desired epoxy resin composition can be obtained by thinly sheeting, cooling and crushing.

Table 4 shows physical property comparison between the encapsulation material comprising an epoxy resin composition of the present embodiment and the conventional encapsulation material comprising an epoxy resin having biphenyl structure.

TABLE 4

Physical properties of the encapsulation material of the present invention and the conventional encapsulation material

| physical property | encapsulation material of the present invention | conventional encapsulation material comprising a epoxy resin having biphenyl structure |
|---|---|---|
| glass transition temperature (Tg) | not less than 150° C. | not more than 130° C. |
| coefficient of linear expansion ($\alpha 1$) | not more than $1.0 \times 10^{-5}$/° C. | not more than $1.0 \times 10^{-5}$/° C. |
| water absorption (PCT 121° C., 100%, 100 RH, 100 hr) | not more than 0.3% | not more than 0.3% |
| flame retardancy (UL 94) | V-0 | V-0 |
| moisture resistance (130° C., 85%, 5.5 v, 1000 hr) | OK | NG |
| high temperature storage (175° C., 1000 hr) | OK | NG |

High temperature storage as an encapsulation material is remarkably improved, since the glass transition temperature (Tg) of the present composition becomes not less than 150° C. by employing (1) an epoxy resin having biphenyl structure mainly as an epoxy resin, (2) a phenolic aralkyl resin mainly as a curing agent, (3) 0.5 to 30 parts by weight of a polyimide resin as an additive based on total 100. parts by weight of the epoxy resin and the curing agent, (4) a polysiloxane compound modified with polyether containing an amino group as a flame retardant, (5) not less than 87% by weight of a fused silica as an inorganic filler based on the total composition.

And by employing a polysiloxane compound modified with polyether containing an amino group as a flame retardant without a halogenated flame retardant and an antimony compound as a conventional flame retardant, there is no harmful influence on environment and V-0 class can be accomplished according to UL94 as a flame retardant standard.

EMBODIMENT 2

A semiconductor device obtained by employing the epoxy resin composition described in the above Embodiment 1 as encapsulation material is explained below.

For example, the above-mentioned epoxy resin composition can be employed as encapsulation material for a semiconductor device, wherein a semiconductor element is mounted on an iron frame, loop length of a wire bond is not more than 3 mm, and ball diameter is not more than 80 $\mu$m. Examples of the device are memory packages such as SOJ type and TSOP type. In these cases loop length becomes short since LOC (lead on tip, wherein inner lead is located on a tip) structure is basic.

And the resin composition can be employed as encapsulation material for a semiconductor device, wherein a semiconductor element is mounted on a copper frame, loop length of a wire bond is not less than 3 mm, and ball diameter is not more than 80 $\mu$m. Examples of the device are packages of micro computer or ASIC (QFP type). In these cases loop length is generally not less than 3mm, since they do not have an LOC structure.

These devices have not more than 5% of flow curvature of gold wire and they are excellent in moisture crack resistance, high temperature storage and flame retardancy.

The above-mentioned epoxy resin composition can be employed in a semiconductor device such as an PBGA type device compatible with multiple pinning and small sizing by arranging ball electrodes on the same face, a CSP type semiconductor device having super small size which has the same body size as a chip, or the like. All these semiconductor devices encapsulated by the above mentioned epoxy resin composition as an encapsulation material have package warp of not more than 50 $\mu$m, and they are excellent in moisture crack resistance, high temperature storage and flame retardancy.

The epoxy resin composition described in above-mentioned Embodiment 1 can be employed as encapsulation material for various type semiconductor devices to provide a semiconductor device having extremely high reliability.

EXAMPLES

Raw materials used in examples are shown below.

Epoxy resin having biphenyl structure: YX-4000H (epoxy equivalent: 193) available from Yuka Shell Epoxy Co., Ltd.

o-Cresol novolak epoxy resin: N-665-EXP (epoxy equivalent: 201) available from Dainippon Ink & Chemicals, Inc.

Phenolic aralkyl resin: XLC-225-4L (hydroxyl equivalent: 169) available from Mitsui Chemicals, Inc.

Phenolic novolak resin: Phenolite TD-2131 (hydroxyl equivalent: 104) available from Dainippon Ink & Chemicals, Inc.

Fused silica: available from Tatsumori Co., Ltd. (maximum particle size: 75 $\mu$m)

Triphenyl phosphine: TPP available from Hokko Chemical Industry Co., Ltd.

Silane coupling agent: KBM403 available from Shin-Etsu Silicone Co., Ltd.

Carnauba wax

Polyimide: XMI-3000 (both terminals were modified with an epoxy resin) available from Mitsui Chemicals, Inc.

Polysiloxane compound modified with polyether containing an amino group: available from Shin-Etsu Chemical Co., Ltd.

Epoxy resin having tetrabromobisphenol-A structure (halogenated flame retardant): Epicron 152-S available from Dainippon Ink & Chemicals, Inc.

Phosphate compound: PX-200 available from Daihachi Chemical Co., Ltd.

Red phosphorus (red phosphorus type flame retardant): Nover Red 120 available from Rin Chemical Industry Co., Ltd.

Examples 1 to 3 and Comparative Example 1

According to the mixing ratio shown in Table-5, raw materials were kneaded at about 90° C. by using a biaxial roll kneading machine made by Kurimoto Co., Ltd. After kneading, the mixture was formed into a thin sheet, cooled and pulverized to obtain the resin composition for encapsulating semiconductor of the present invention.

TABLE 5

| Composition (parts by weight) | Ex. No. 1 | Ex. No. 2 | Ex. No. 3 | Com. Ex. No. 1 |
|---|---|---|---|---|
| Main agent | | | | |
| Epoxy resin having biphenyl structure | 4.3 | 4.46 | 4.2 | 4.3 |
| o-Cresol novolak epoxy resin | 0.8 | 0.8 | 0.6 | 0.8 |
| Curing agent | | | | |
| Phenolic aralkyl resin | 3.76 | 3.90 | 3.66 | 3.76 |
| Phenolic novolak resin | 0.41 | 0.41 | 0.31 | 0.61 |
| Fused silica | 87 | 87.2 | 87 | 87 |
| Triphenyl phosphine | 0.3 | 0.3 | 0.3 | 0.3 |
| Silane coupling agent | 0.6 | 0.6 | 0.6 | 0.6 |
| Carnauba wax | 0.3 | 0.3 | 0.3 | 0.3 |
| Carbon black | 0.03 | 0.03 | 0.03 | 0.03 |
| Polyimide | 1.0 | 0.5 | 1.5 | 0 |
| Polysiloxane compound modified with polyether | 1.5 | 1.5 | 1.5 | 0 |
| Brominated epoxy resin | — | — | — | 0.8 |
| Antimony trioxide | — | — | — | 1.5 |

(Evaluation of Properties)

After the obtained resin composition was cured by heating at 175° C. for 5 hours, each property of the cured article was observed according to the following methods.

① Glass Transition Temperature

A glass transition temperature was measured from intersection of the straight lines at the glass area and the rubber area according to Thermal Mechanical Analysis method (TMA).

② Coefficient of Linear Thermal Expansion

A sample having a size of 5 mm (width)×5 mm (height)×15 mm (length) was heated at a heating ratio of 2° C./min and coefficient of linear thermal expansion was measured by using TMA. The coefficient was calculated by substituting the measured value into the following equation:

$$\alpha_1 = \frac{b_1 - a_1}{5 \times L \times 10^4}$$

wherein $a_1$ indicates expansion length ($\mu$m) at 50° C. and $b_1$ indicates expansion length ($\mu$m) at 100° C.

③ Water Absorption

The cured composition was cut into a sample piece having a diameter of 50 mm and a thickness of 3 mm. The sample was dried in a dryer at 125° C. for 24 hours to evaporate water absorbed in the cured composition. The initial weight was measured and absorption was carried out at 121° C. with 2 atm for 10 hr. A weight after absorption was measured and water absorption ratio was calculated by the following equation:

$$\text{Water absorption} = \frac{\text{Weight after absorption} - \text{Initial weight}}{\text{Initial weight}} \times 100$$

④ Flame Retardancy

Flame retardancy was measured according to UL 94 standard method by using a sample having a size of 1.5 mm (thickness)×12.7 mm (width)×127 mm (length).

⑤ Spiral Flow

Spiral flow was observed by using EMMI-1-66 standard metal mold. About 15 g of sample resin was flowed into the metal mold set to 175° C. with a pressure of 6.9 MPa to measure flow length of the resin.

⑥ Gel Time

About 1 g of sample resin was placed on a plate heated to 175° C. and the resin was spread by, using a spatula. Time was measured until resin was cured by using a stop watch.

⑦ Minimum Melt Viscosity

A polymer chemical type flow tester made by Shimadzu Corporation was charged with 3 g of sample resin and the minimum melt viscosity was measured at 175° C. with a load of 10 kg by using a nozzle of 1.00±0.02 mmΦ×10 mm.

⑧ Moisture Resistance

The same sample as in the above ③ was prepared and 22 samples were kept in a pressure cooker test (PCT) at 130° C. in a relative humidity (RH) of 85% at 5.5 V for 1000 hours. After that, shape change was visibly evaluated to show the number of the bad sample in Table 6.

⑨ High Temperature Storage

The same sample as in the above ③ was prepared and the sample was kept in an oven at 175° C. for 1000 hours. After that, shape change was visibly evaluated to show the number of the bad sample in Table 6.

The results are shown in Table 6.

TABLE 6

| | | Ex. No. 1 | Ex. No. 2 | Ex. No. 3 | Com. Ex. No. 1 |
|---|---|---|---|---|---|
| Property | Glass transition temperature (° C.) | 165 | 153 | 169 | 130 |
| | Coefficient of linear thermal expansion ($\alpha_1$) (° C.$^{-1}$) | $0.9 \times 10^{-5}$ | $0.9 \times 10^{-5}$ | $0.9 \times 10^{-5}$ | $0.9 \times 10^{-5}$ |
| | Water absorption (%) | 0.25 | 0.23 | 0.28 | 0.23 |
| | Flame retardancy (UL 94) | V-0 | V-0 | V-0 | V-0 |
| | Spiral flow (cm) | 130 | 130 | 125 | 140 |
| | Gel time (min) | 30 | 30 | 30 | 30 |
| | Minimum melt viscosity (Pa · s) | 9.0 | 8.7 | 10.0 | 8.0 |
| Characteristics | Moisture resistance (130° C., 83%, 5.5 v, 2000 hr) | 0/22 | 0/22 | 0/22 | 1/22 |
| | High temperature storage (175° C., 1000 hr) | 0/22 | 0/22 | 0/22 | 2/22 |

By the present invention high temperature storage was remarkably improved, since the glass transition temperature (Tg) of the composition became not less than 150° C. by employing an epoxy resin having biphenyl structure mainly as an epoxy resin, a phenolic aralkyl resin mainly as a curing agent, a polysiloxane compound modified with polyether containing an amino group as a flame retardant, a polyimide resin as an additive, and not less than 87% by weight of an inorganic filler based on the total composition.

And by employing a polysiloxane compound modified with polyether containing an amino group as a flame retardant without a halogenated flame retardant and an antimony compound as a conventional flame retardant, there could be no harmful influence on environment and high flame retardancy could be accomplished.

What is claimed is:

1. An epoxy resin composition for semiconductor encapsulation comprising an epoxy resin, a curing agent, an inorganic filler, a catalyst, a flame retardant and an additive, wherein the resin composition is obtained by employing the epoxy resin mainly containing an epoxy resin having biphenyl structure, the curing agent mainly containing a phenolic aralkyl resin, a polysiloxane compound modified with polyether containing an amino group as the flame retardant, a polyimide resin as the additive, wherein both end groups of the polyimide resin are modified with an epoxy resin or a phenolic resin, and not less than 87% by weight of the inorganic filler based on the total composition.

2. The epoxy resin composition of claim 1, wherein 0.5 to 30 parts by weight of the polyimide resin as an additive is mixed based on total 100 parts by weight of the epoxy resin and the curing agent.

3. The epoxy resin composition of claim 1, wherein fused silica having not more than 75 μm of maximum diameter is employed as the inorganic filler.

4. The epoxy resin composition of claim 1, wherein a phosphorus catalyst or a latent phosphorus catalyst is employed as the catalyst.

5. A semiconductor device encapsulated by an epoxy resin composition for semiconductor encapsulation comprising an epoxy resin, a curing agent, an inorganic filler, a catalyst, a flame retardant and an additive, wherein the resin composition is obtained by employing the epoxy resin mainly containing an epoxy resin having biphenyl structure, the curing agent mainly containing a phenolic aralkyl resin, a polysiloxane compound modified with polyether containing an amino group as the flame retardant, a polyimide resin as the additive, and not less than 87% by weight of the inorganic filler based on the total composition, wherein a semiconductor element is mounted on an iron frame, and loop length of a wire bond is not more than 3 mm.

6. A semiconductor device encapsulated by an epoxy resin composition for semiconductor encapsulation comprising an epoxy resin, a curing agent, an inorganic filler, a catalyst, a flame retardant and an additive, wherein the resin composition is obtained by employing the epoxy resin mainly containing an epoxy resin having biphenyl structure, the curing agent mainly containing a phenolic aralkyl resin, a polysiloxane compound modified with polyether containing an amino group as the flame retardant, a polyimide resin as the additive, and not less than 87% by weight of the inorganic filler based on the total composition, wherein a semiconductor element is mounted on a copper frame, and loop length of a wire bond is not less than 3 mm.

* * * * *